United States Patent [19]
Fukumoto et al.

[11] Patent Number: 5,786,616
[45] Date of Patent: Jul. 28, 1998

[54] SEMICONDUCTOR INTEGRATED CIRCUIT HAVING AN SOI STRUCTURE, PROVIDED WITH A PROTECTIVE CIRCUIT

[75] Inventors: Harutsugu Fukumoto, Anjo; Hiroaki Tanaka, Okazaki; Akiyoshi Asai, Aichi-gun, all of Japan

[73] Assignee: Nippondenso, Co., Ltd., Kariya, Japan

[21] Appl. No.: 926,997

[22] Filed: Sep. 10, 1997

Related U.S. Application Data

[63] Continuation of Ser. No. 530,739, Sep. 19, 1995, abandoned.

[30] Foreign Application Priority Data

Sep. 19, 1994 [JP] Japan ................... 6-222902

[51] Int. Cl.$^6$ ................... H01L 27/02
[52] U.S. Cl. ................... 257/358; 257/379; 257/350; 257/360; 257/355
[58] Field of Search ................... 257/379, 350, 257/357, 358, 359, 360, 347, 355

[56] References Cited

U.S. PATENT DOCUMENTS

| | | | |
|---|---|---|---|
| 3,673,428 | 6/1972 | Athanas | 257/358 |
| 3,712,995 | 1/1973 | Steuder | 257/357 |
| 3,967,295 | 6/1976 | Stewart | 257/358 |
| 4,143,391 | 3/1979 | Suzuki et al. | 257/358 |
| 4,989,057 | 1/1991 | Lu | 257/357 |
| 5,399,507 | 3/1995 | Sun | 437/24 |
| 5,489,792 | 2/1996 | Hu et al. | 257/347 |

FOREIGN PATENT DOCUMENTS

| | | |
|---|---|---|
| 4345064 | 12/1992 | Japan. |
| 6310658 | 11/1994 | Japan. |
| 7-15016 | 1/1995 | Japan. |

*Primary Examiner*—David B. Hardy
*Attorney, Agent, or Firm*—Cushman Darby & Cushman IP Group of Pillsbury Madison & Sutro LLP

[57] ABSTRACT

A SOI semiconductor integrate circuit device, which can protect against surges between a signal-input terminal and power-supply input terminal thereof to obtain an improved electrostatic withstand quantity, is disclosed. An inverter circuit which is an integrated circuit is formed in a thin-film semiconductor layer formed through an insulation film on a p-type silicon substrate. An n-type diode diffusion region, resistor diffusion region, and FET diffusion region are formed within the silicon substrate. An input portion of the inverter circuit is connected through the resistor diffusion region to a signal-input terminal IN. A power-supply input terminal VC is connected to a ground terminal GND through a reverse-biased diode D formed by the diode diffusion region. When surge is applied to the signal-input terminal IN, a parasitic diode DD composed by the resistor diffusion region and silicon substrate exhibits avalanche breakdown and surge voltage is bypassed. An electrostatic withstand quantity of the inverter circuit can be increased.

38 Claims, 6 Drawing Sheets

SEMICONDUCTOR INTEGRATED CIRCUIT HAVING AN SOI STRUCTURE, PROVIDED WITH A PROTECTIVE CIRCUIT

This is a continuation of application No. 08/530,739, filed on Sep. 19, 1995, which was abandoned upon the filing hereof.

CROSS REFERENCE TO RELATED APPLICATION

This application is based upon and claims the benefit of priority of the prior Japanese Patent application No. 6-222902 filed on Sep. 19, 1994, the contents of which are incorporated herein by reference.

BACKGROUND OF THE INVENTION

1. Field of the Invention

The present invention is related to a semiconductor integrated circuit device provided with a structure to protect the integrated circuit from surge inputs applied to a signal-input terminal of an integrated circuit having an SOI structure.

2. Related Arts

A semiconductor integrated circuit in which an integrated circuit is formed in a semiconductor substrate of silicon or the like may provide an input-protection circuit composed of a diode in an input portion of the circuit and a resistor or transistor or the like as a structure accommodating surge input and the like from an external portion to protect the integrated circuit from electrostatic destruction. However, in a device of SOI structure having an integrated circuit provided in a thin-film semiconductor layer formed through silicon on insulator, there existed the problem that current capacity is greatly restricted because cross-sectional area of the current path is small even when a diode is formed in the thin-film semiconductor layer as an input-protection circuit such as was described above, and the electrostatic withstand quantity cannot be enlarged.

In this regard, to solve problems such as this, the prior art may be a structure which acquires current capacity not by forming a protection circuit in a thin-film semiconductor layer but by forming a protection circuit within a silicon substrate under an insulation film, as is indicated for example in Japanese Patent Application Laid-open No. 4-345064. Large current can thereby be caused to flow through the protection circuit within the silicon substrate and electrostatic withstand quantity can be caused to be greatly increased in a case where surge is applied to the signal-input terminal.

However, although the prior-art structure such as was described above, can protect against surge inputs applied between the signal-input terminal and a ground terminal (reference power-supply input terminal) by a protection circuit formed within the silicon substrate, for surges applied between a power-supply input terminal (positive power-supply input terminal) and the signal-input terminal there still exists danger of surges applied to the integrated-circuit side. This may cause electrostatic destruction because a structure to protect against these types of surges does not exist, and electrostatic withstand against various surges could not be increased.

SUMMARY OF THE INVENTION

In light of the foregoing circumstances, it is an object of the present invention to provide a semiconductor integrated circuit device which can increase an electrostatic withstand quantity against a surge applied between a direct-current power-supply input terminal and a signal-input terminal in an integrated circuit of SOI structure providing an integrated circuit in a thin-film semiconductor layer formed through an insulation film in a semiconductor substrate.

The present invention is a semiconductor integrated circuit device composed of an integrated circuit formed in a thin-film semiconductor layer disposed through an insulation film on a semiconductor substrate having a first conductivity type, comprising: a resistor diffusion region formed by diffusing impurities having a second conductivity type which differs from the first conductivity type within the semiconductor substrate so as to be electrically connected between a signal-input portion and a signal-input terminal of the integrated circuit; and a diode diffusion region formed by diffusing impurities having the second conductivity type within the semiconductor substrate so as to be electrically connected with reverse bias between a pair of direct-current power-supply input terminal of the integrated circuit.

Additionally, formation of the resistor diffusion region and the diode diffusion region in adjacent positions is preferred.

According to a semiconductor integrated circuit device of the present invention, in a case where a level of surge input is negative with respect to the signal-input terminal when surge input has been applied between the signal-input terminal and positive direct-current power-supply input terminal, forward-bias voltage comes to be applied between the resistor diffusion region and the semiconductor substrate, and along with this, large reverse-bias voltage corresponding to the surge-input level comes to be applied between the semiconductor substrate and the diode diffusion region, and a diode formed thereby between the semiconductor substrate and the diode diffusion region causes avalanche breakdown and allows current to flow. Because of this, current flows from the positive direct-current power-supply input terminal toward the signal-input terminal and surge input can be absorbed, and electrostatic destruction of the integrated circuit can be prevented.

Additionally, in a case where a level of surge input is positive with respect to the signal-input terminal when surge input has been applied between the signal-input terminal and positive direct-current power-supply input terminal, forward-bias voltage comes to be applied between the semiconductor substrate and the diode diffusion region, and along with this, large reverse-bias voltage corresponding to the surge-input level comes to be applied between the resistor diffusion region and the semiconductor substrate, and a parasitic diode formed thereby between the resistor diffusion region and the semiconductor substrate causes avalanche breakdown and allows current to flow. Because of this, current flows from the signal-input terminal toward the positive direct-current power-supply input terminal and surge input can be absorbed, and electrostatic withstand quantity of the integrated circuit can be caused to increase.

Furthermore, when the resistor diffusion region and diode diffusion region formed within the semiconductor substrate are disposed in adjacent positions, it becomes possible to allow current which flows when either diffusion region has caused avalanche breakdown as described above to flow through a short path in the interior of the semiconductor substrate, and absorption of surge input is performed efficiently and the electrostatic withstand quantity can be further caused to increased.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY

Preferred Exemplary Embodiments

A first embodiment of a case where the present invention is applied in a CMOS IC of SOI structure utilizing a silicon substrate will be described hereinafter with reference to the drawings.

Figure 1:
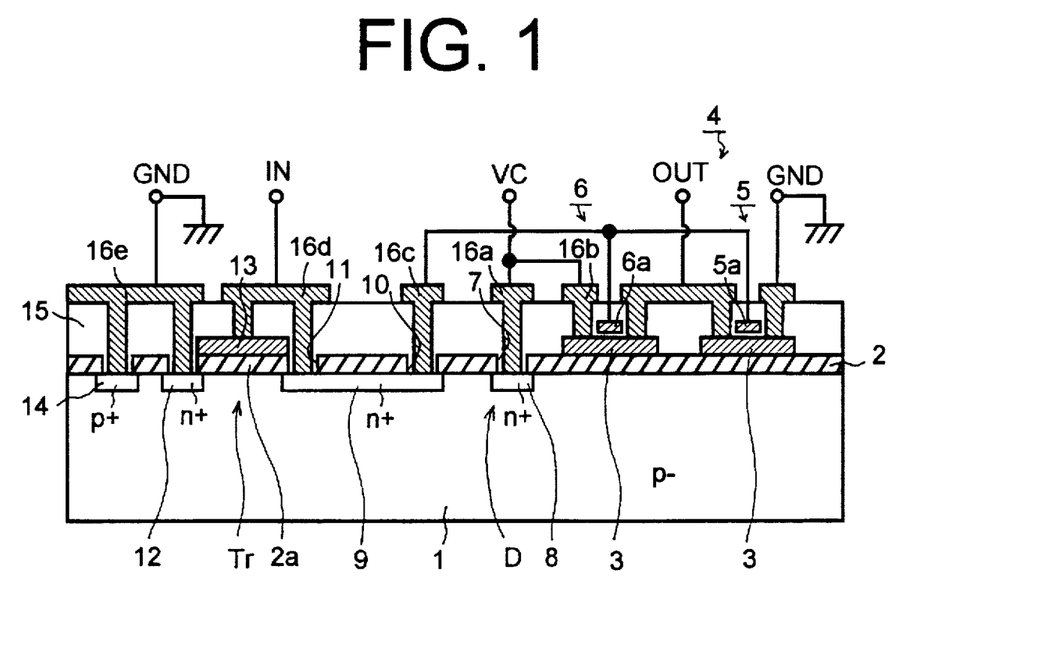
FIG. 1 is a schematic sectional view indicating an entirety of a first embodiment according to the present invention.
Figure 2:
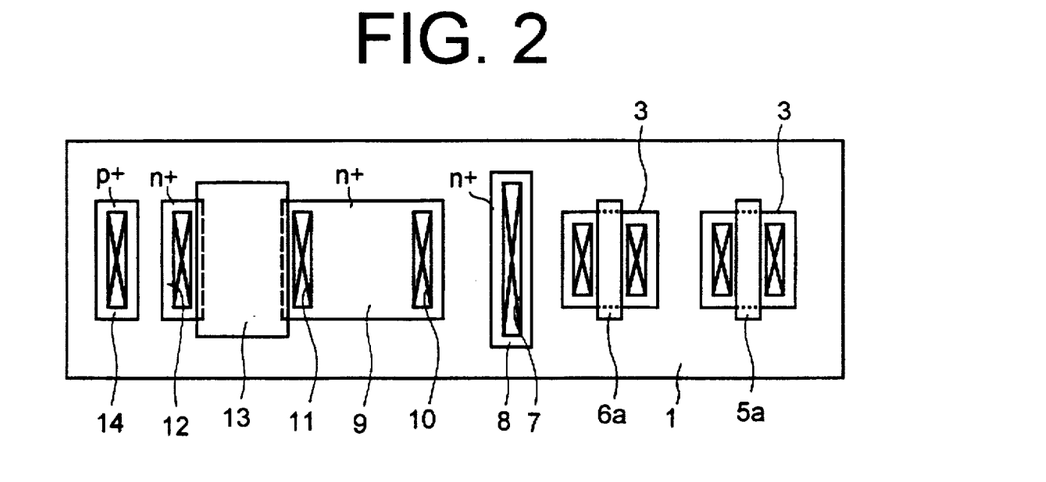
FIG. 2 is a plan view of the first embodiment with surface electrodes removed.

In FIG. 1, which indicates a schematic sectional view of the entirety and FIG. 2 which indicates a plan view of a state where electrodes have been removed, an insulation film 2 composed of a silicon oxide film or the like is formed over substantially an entirety of a surface of a p-type low-impurity-concentration silicon substrate 1 which is a semiconductor substrate, and a thin-film semiconductor layer 3 is formed thereabove.

For example a CMOS inverter circuit 4 is formed as a signal-input portion of the integrated circuit in the thin-film semiconductor layer 3. The inverter circuit 4 is made up of an n-channel type MOSFET 5 and a p-channel type MOSFET 6. The respective MOSFETs 5 and 6 are caused to be a structure having gates 5a and 6a formed through source, drain, and gate oxide films formed in the thin-film semiconductor layer 3. A window 7 is formed in the insulation film at a position adjacent to the inverter circuit 4, and a diode diffusion region 8 formed by diffusing n-type impurities at high concentration is disposed within the silicon substrate 1 of the portion thereof. Accordingly, a diode D is formed by a pn junction of this n-type diode diffusion region 8 and p-type silicon substrate 1.

Additionally, a resistor diffusion region 9 formed by diffusing n-type impurities at high concentration in the interior of the silicon substrate 1 is formed at a position which is adjacent to the diode diffusion region 8, and windows 10 and 11 are formed at both ends of this resistor diffusion region 9. Accordingly, the resistor diffusion region 9 is structured as a resistor R having a predetermined resistance value by a region formed in a lateral direction between these windows 10 and 11.

Furthermore, an FET diffusion region 12 formed by diffusing n-type impurities at high concentration is formed at a location in the interior of the silicon substrate 1 which is adjacent to the resistor diffusion region 9. A gate 13 is formed on an insulation film 2a formed on a surface between this FET diffusion region 12 and the resistor diffusion region 9, and an n-channel MOS type field-effect transistor (MOSFET) Tr is structured by these. Furthermore, a contact diffusion region 14 formed by diffusing p-type impurities at high concentration in the interior of the silicon substrate 1 is formed at a position which is adjacent to this FET diffusion region 12.

A protective insulation film 15 is formed over an entire surface except for predetermined areas of an upper portion formed as described above, and thereafter electrodes 16 are formed by aluminum evaporation or the like so as to electrically connect the several portions. In this case, the diode diffusion region 8 is connected by an electrode 16a and through a positive direct-current power-supply input terminal (maximum-potential terminal) VC to an external power supply, and along with this, is connected to a source electrode 16b of the MOSFET 6 of the inverter circuit 4.

An electrode 16c formed on the side of the resistor diffusion region 9 which is adjacent to the diode diffusion region 8 is connected commonly to gates of the MOSFETs 5 and 6 which are input portions of the inverter circuit 4, and an electrode 16d formed on the other side of the resistor diffusion region 9 is connected commonly with an electrode formed at the gate 13 of the transistor Tr to a signal-input terminal IN which leads to an external portion. Additionally, an electrode 16e formed in the FET diffusion region 12 is connected commonly with an electrode formed at the contact diffusion region 14 to another direct-current power-supply input terminal (minimum-potential terminal) GND, and is grounded.

Furthermore, according the foregoing structure, the pn junction of the diode D made up from the diode diffusion region 8 and silicon substrate 1 causes avalanche breakdown and reverse current flows when a predetermined reverse-bias voltage or more is applied. Additionally, the pn junction formed between the resistor diffusion region 9 and the silicon substrate 1 functions as a parasitic diode DD, and with this parasitic diode DD as well, the pn junction causes avalanche breakdown and reverse current flows when a predetermined reverse-bias voltage or more is applied, similarly to the foregoing diode D.

Figure 3:
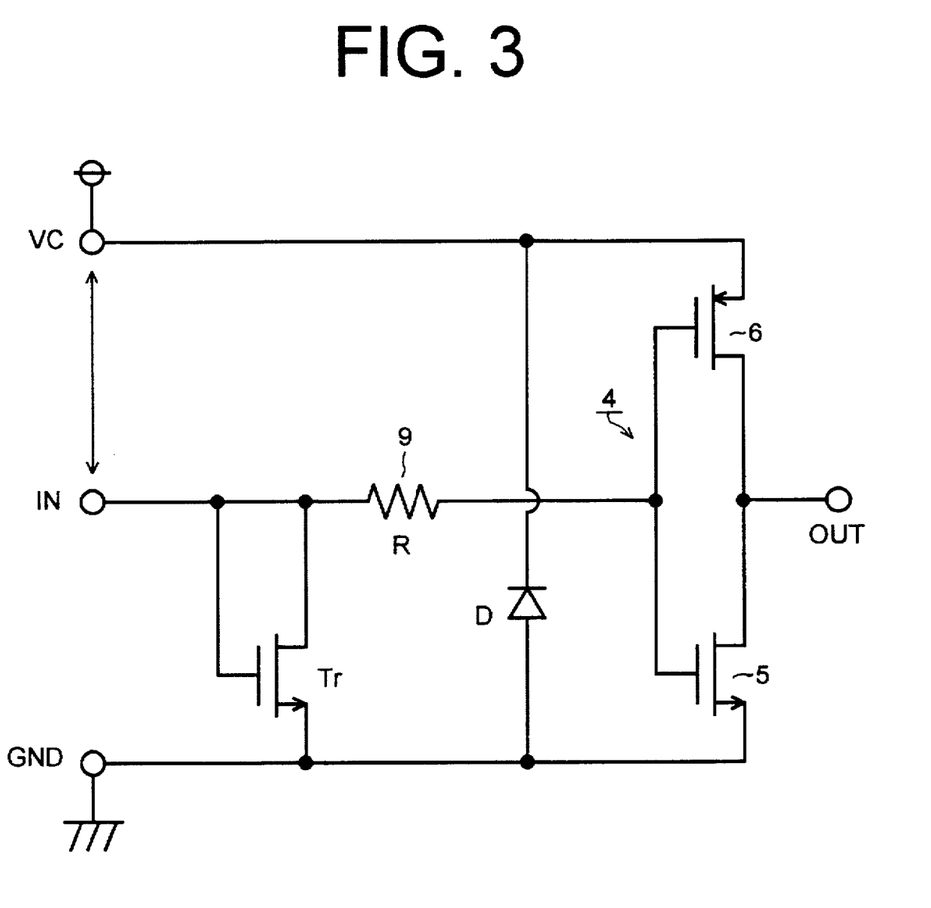
FIG. 3 is an electrical equivalent circuit diagram according to embodiment.

FIG. 3 indicates an electrical equivalent circuit of the above-described structure; the inverter circuit 4 is connected between the direct-current power-supply input terminal VC and the ground terminal GND, and the signal-input terminal IN is connected through the resistor R to the gate which is an input portion of the inverter circuit 4. Accordingly, the diode D is connected with reverse bias between the direct-current power-supply input terminal VC and the ground terminal GND, and the transistor Tr is in a state of connection between the signal-input terminal IN and the ground terminal GND. Additionally, output of the inverter circuit 4 is output from a signal-output terminal OUT.

A mode of operation according to the present embodiment will be described next with reference to FIGS. 4 to 7.

Firstly, a case where a surge which becomes negative with respect to the power-supply input terminal VC has been applied to the signal-input terminal IN will be described. In this case, in the equivalent circuit indicated in FIG. 5, there exists no path where surge current is absorbed, and the surge comes to be applied to the inverter-circuit 4 side. In this case, however, large voltage is applied to the diode D between the diode diffusion region 8 and the silicon substrate 1 and avalanche breakdown is caused, and a current path extending from the silicon substrate 1 through the parasitic diode DD (indicated by broken lines in FIG. 5) formed in the resistor diffusion region 9 portion and to the input-terminal IN side is formed thereby, and the surge current is bypassed.

Figure 4:
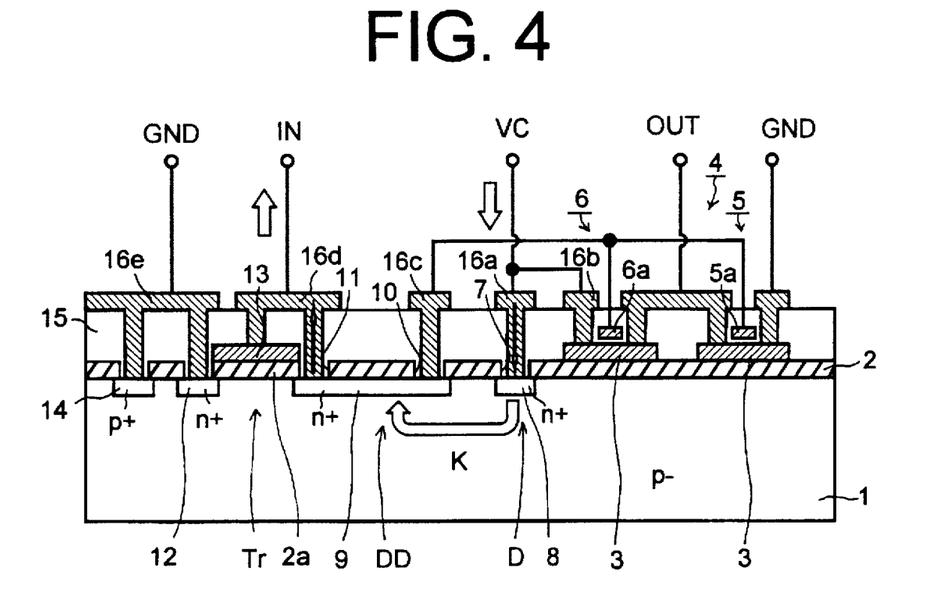
FIG. 4 is a view corresponding to FIG. 1 which indicates a current path during negative surge application.
Figure 5:
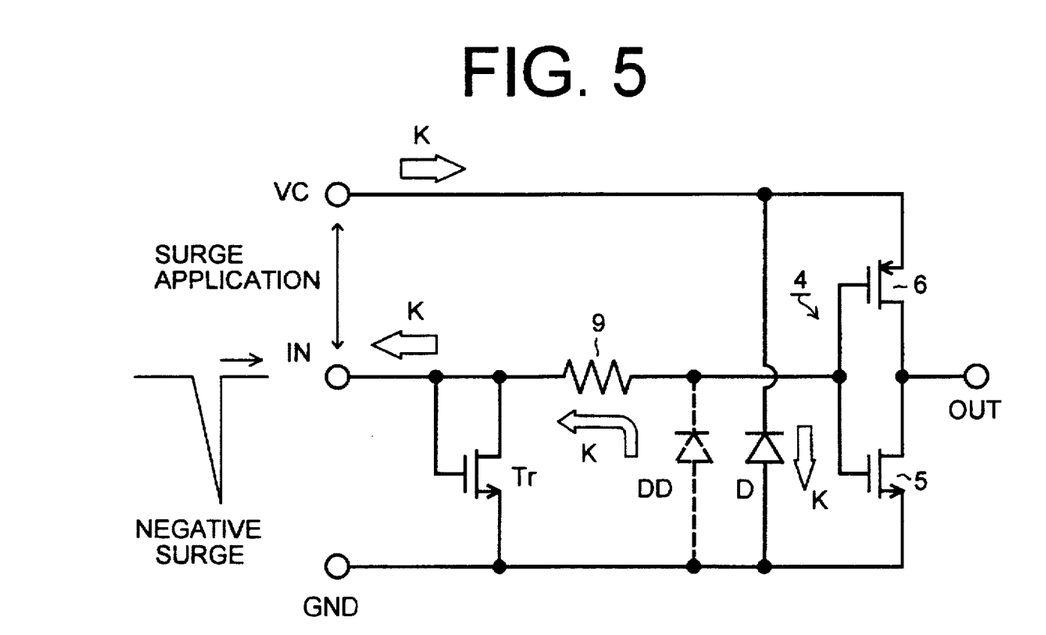
FIG. 5 is a diagram corresponding to FIG. 3 which indicates a current path during negative surge application.

Consequently, the surge current flows from the power-supply input terminal VC through the diode diffusion region 8 and silicon substrate 1 to reach the resistor diffusion region 9, and flows therefrom through the path linked to the signal-input terminal IN, as is indicated by arrows K in FIGS. 4 and 5. Thereby, the surge current is bypassed and application of excess voltage to the input portion of the inverter circuit 4 can be prevented.

A case where a surge which is higher than direct-current voltage of the power-supply input terminal VC is applied to the signal-input terminal IN will be described next. In this case, in the equivalent circuit indicated in FIG. 7, there exists no path where surge current is absorbed, and the surge comes to be applied to the inverter-circuit 4 side. In this case, however, reverse-bias voltage comes to be applied to the parasitic diode DD (indicated by broken lines in FIG. 7) formed between the resistor diffusion region 9 and the silicon substrate 1 midway from the signal-input terminal IN through the resistor diffusion region 9 and extending to the inverter circuit 4, such that the parasitic diode DD causes avalanche breakdown when this reverse-bias voltage becomes a predetermined voltage or more.

Figure 6:
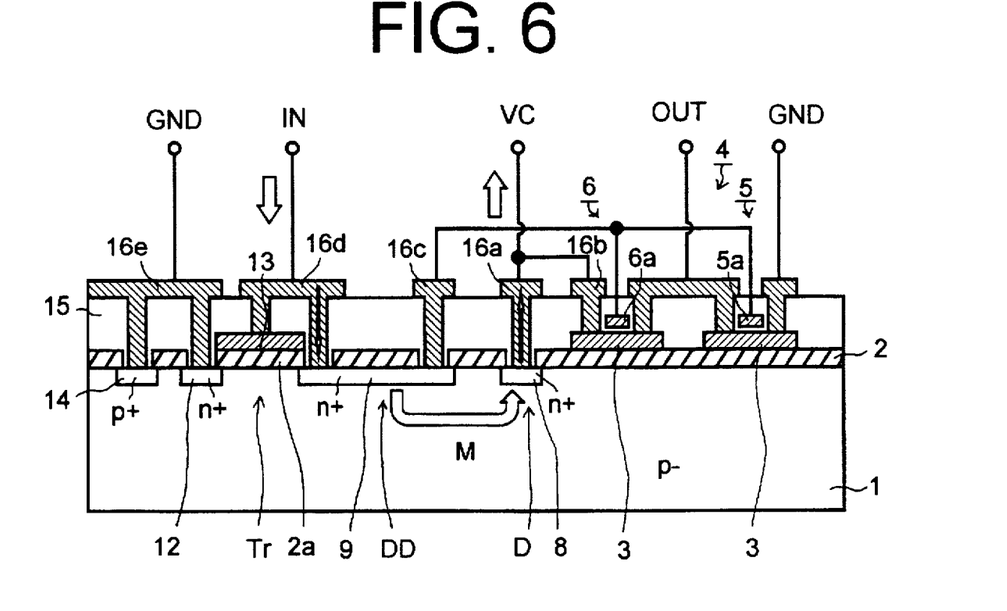
FIG. 6 is a view corresponding to FIG. 1 which indicates a current path during positive surge application.
Figure 7:
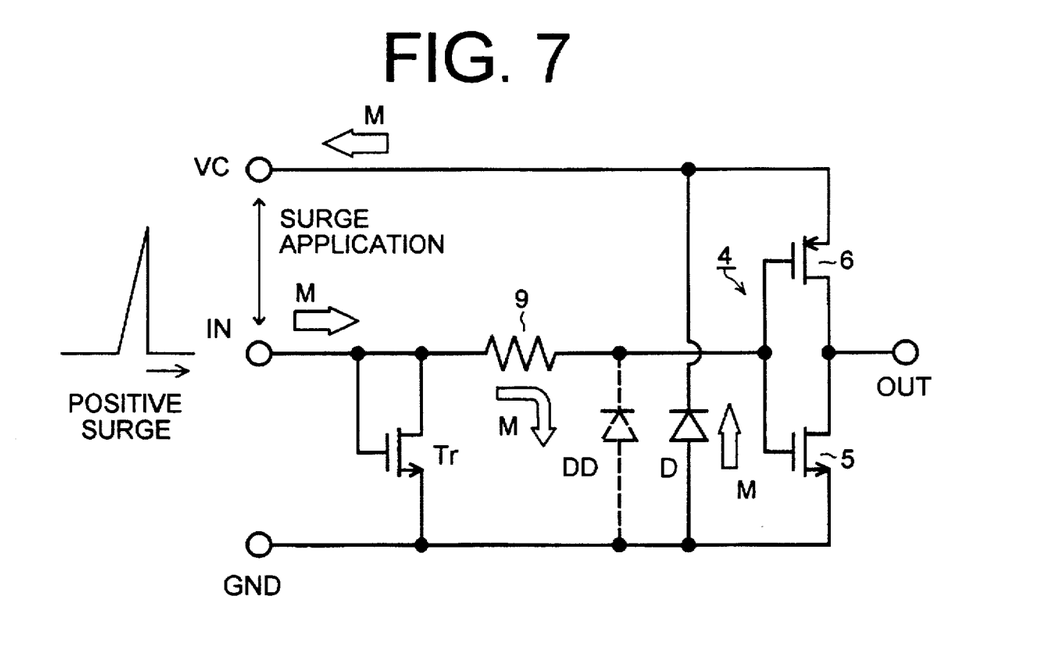
FIG. 7 is a diagram corresponding to FIG. 3 which indicates a current h during positive surge application.

Consequently, the surge current flows from the input terminal IN through the resistor diffusion region 9 and silicon substrate 1 to reach the diode diffusion region 8, and flows therefrom through the path linked to the power-supply input terminal VC, as is indicated by arrows M in FIGS. 6 and 7. Thereby, the surge current is bypassed and application of excess voltage to the input portion of the inverter circuit 4 can be prevented.

Additionally, for surge applied between the signal-input terminal IN and ground terminal GND, surge current can be bypassed by switching on the MOS type field-effect transistor Tr.

Because a structure having a diode diffusion region 8, resistor diffusion region 9, and FET diffusion region 12 is utilized according to this first embodiment, avalanche breakdown is caused in either case with respect to surges applied between the signal-input terminal IN and the direct-current power-supply input terminal VC it becomes possible to cause these surge currents to be bypassed. Moreover , because it becomes possible to cause currents to be bypassed with respect to surge applied between the input terminal IN and ground terminal GND as well, the inverter circuit 4 which is an integrated circuit of SOI structure can be protected, and from electrostatic destruction, and input protection can be increased.

A second embodiment will be described next with reference to FIGS. 8 to 11.

Figure 8:
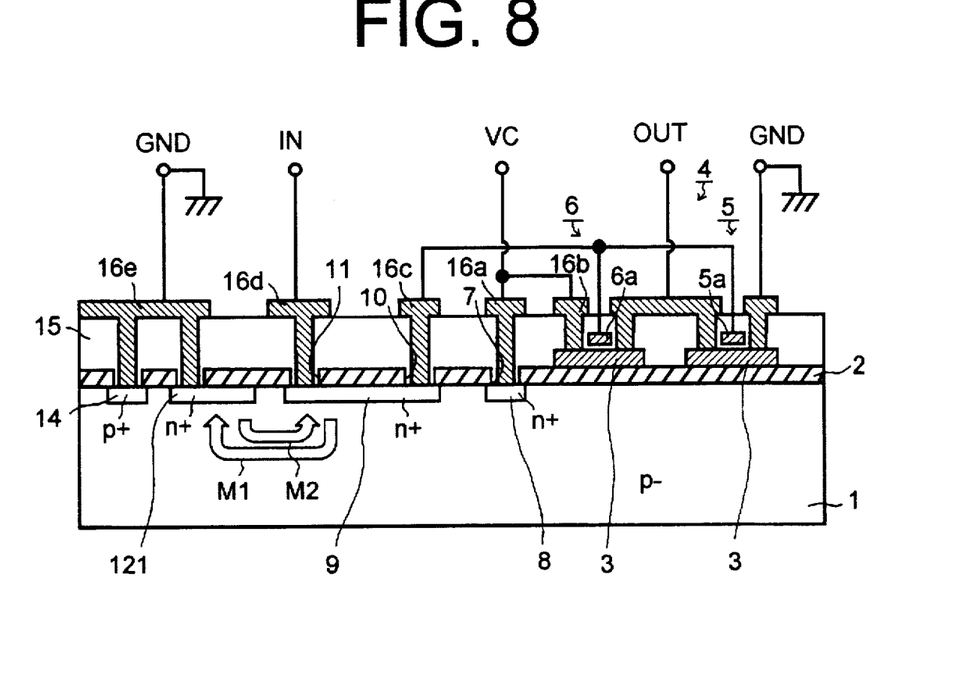
FIG. 8 is a schematic sectional view of a second embodiment according to the present invention.

FIG. 8 is a schematic sectional view of the second embodiment, which does not form a transistor for input-protection use Tr but instead causes to form a diode which causes avalanche breakdown. An $n^+$ diffusion region 121 electrically connected to a ground terminal GND is formed within a silicon substrate 1 in a proximity of a resistor diffusion region 9.

Figure 9:
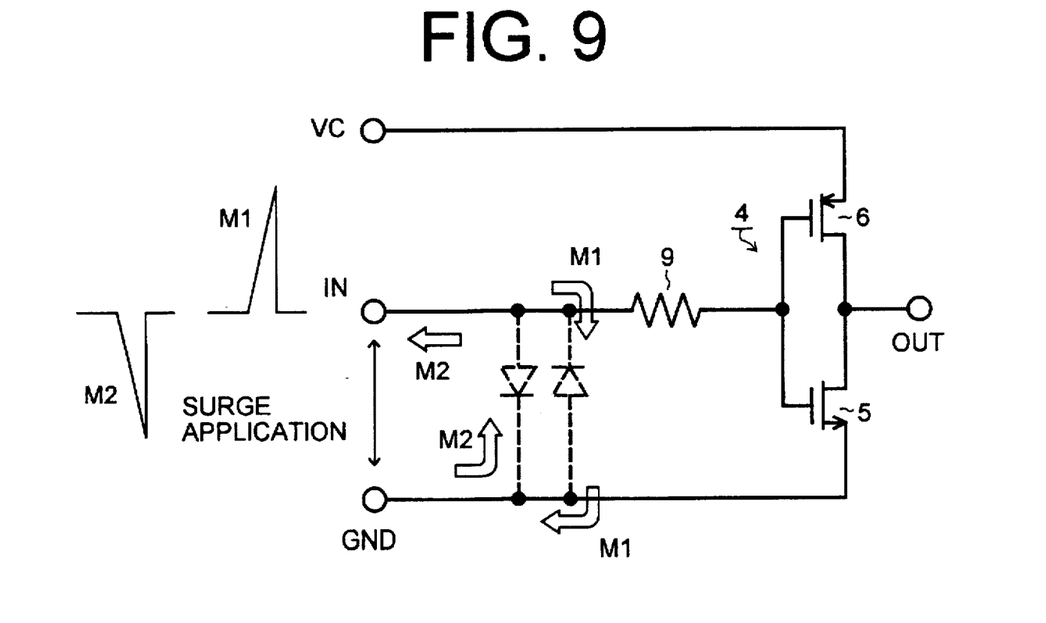
FIG. 9 is an electrical equivalent circuit of FIG. 8 showing a.current path when surge exists between a signal-input terminal IN and ground terminal GND.

In such a structure, dissipation can be caused by avalanche breakdown occurring at a pn diode which is either a pn diode between the silicon substrate 1 and the $n^+$ diffusion region 121 or a pn diode between the silicon substrate 1 and the resistor diffusion region 9 when surge voltages M1 and M2 are applied between the ground terminal GND and a signal-input terminal IN, as shown in FIG. 9. That is to say, an npn structure is formed among the $n^+$ diffusion region 121, silicon substrate 1, and resistor diffusion region 9, and avalanche breakdown occurs at either the np or the pn junction due to the surge voltage applied. The present embodiment utilizes this characteristic.

Because of this, input protection can be performed against surge voltages of both polarities.

Figure 10:
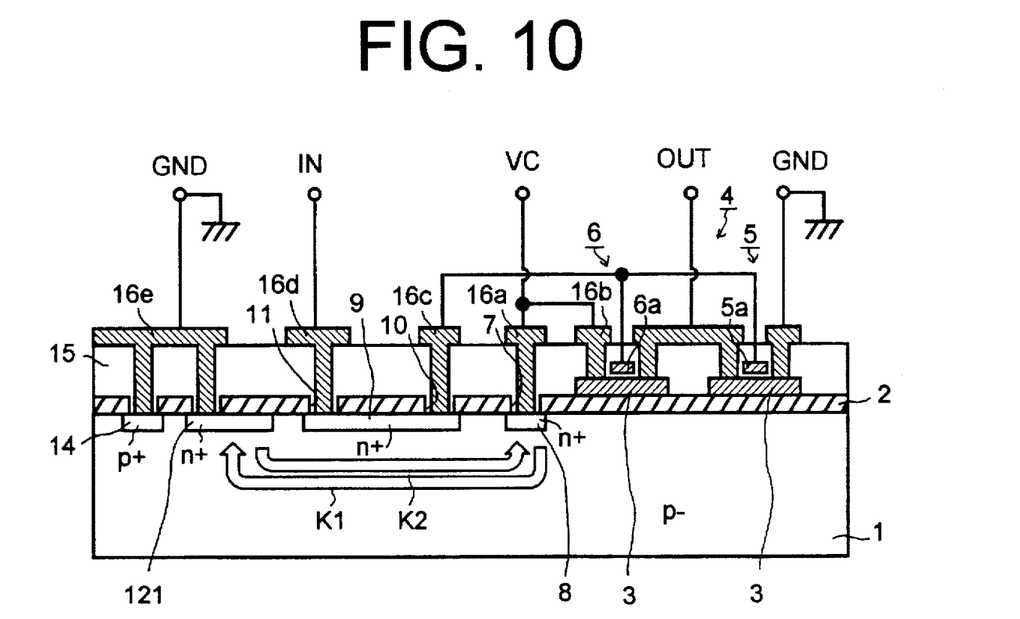
FIG. 10 is a view corresponding to FIG. 8 showing a current path when surge exists between a positive direct-current power-supply input terminal VC and a ground terminal GND.
Figure 11:
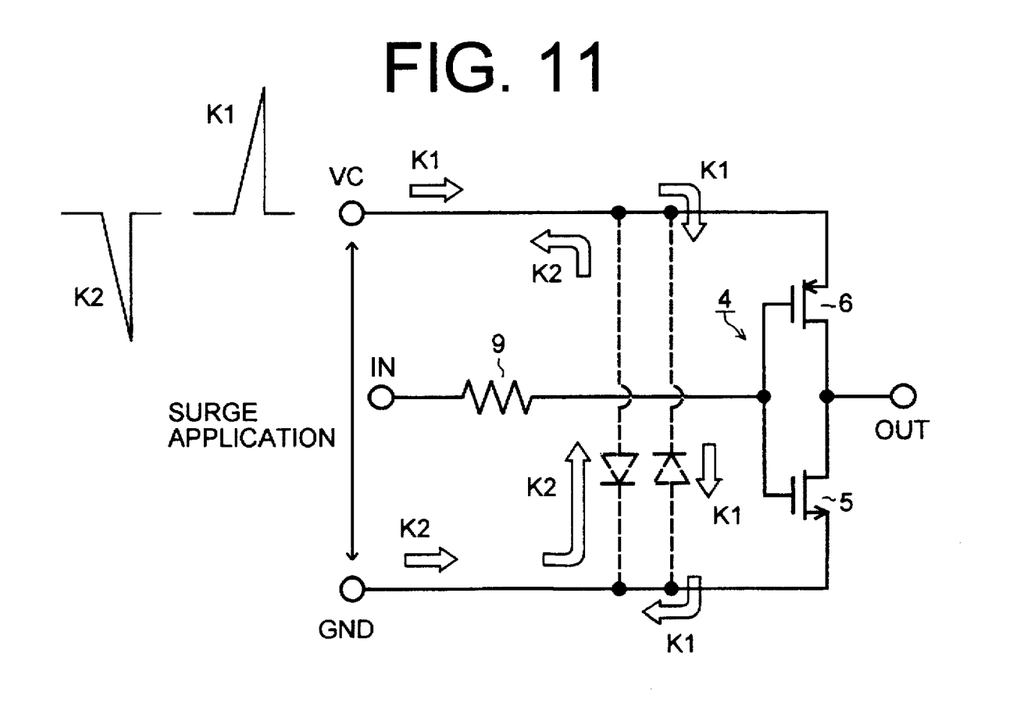
FIG. 11 is an electrical equivalent circuit of FIG. 10.

Additionally, FIG. 10 indicates a surge-absorbing operation when surge voltage is applied between the ground terminal GND and direct-current power-supply terminal VC in FIG. 8. As shown in FIG. 11, an npn structure is formed via the silicon substrate 1 between the ground terminal GND and direct-current power-supply terminal VC as well, similarly to between the above-described ground terminal GND and signal-input terminal IN, and even when surge voltage is applied between these two terminals, the surge voltage thereof can be caused to dissipate by avalanche breakdown occurring at either the np or the pn junction.

The present invention is not limited to the above-described embodiments, but can be modified or expanded as will be described hereinafter.

The present invention is not limited to the inverter circuit 4, but can also be applied in an integrated circuit of SOI structure which is a CPU, DSP, or the like for example in a microcomputer.

The present invention can be applied similarly with respect also to a semiconductor integrated circuit of SOI structure which employs an n-type silicon substrate, except that polarity of respective elements is reversed.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor integrated circuit device comprising:

an integrated circuit formed in a thin-film semiconductor layer disposed on a semiconductor substrate of a first conductivity type with an insulation film interposed therebetween, said semiconductor integrated circuit device being provided with a signal-input terminal, maximum-potential terminal, and minimum-potential terminal;

a resistor diffusion region of a second conductivity type formed within said semiconductor substrate so as to be electrically connected between a signal-input portion of said integrated circuit and said signal-input terminal;

a diode diffusion region of said second conductivity type formed within said semiconductor substrate adjacent to said resistor diffusion region and connected to one of said maximum-potential terminal and said minimum-potential terminal;

a contact diffusion region of said first conductivity type formed within said semiconductor substrate and connected to another of said maximum-potential terminal and said minimum-potential terminal, whereby said diode diffusion region reverse-biases between said maximum-potential terminal and minimum-potential terminal;

a FET diffusion region of said second conductivity type formed within said semiconductor substrate; and a a gate electrode formed on said semiconductor substrate with an insulation film interposed therebetween so as to be located over a surface between said FET diffusion region and said resistor diffusion region, wherein a MOSFET for input-protection use is formed between said signal-input terminal and said other potential terminal by electrically connecting said resistor diffusion region and said gate electrode to said signal-input terminal and by causing said FET diffusion region to be equipotential with said contact diffusion region.

2. A semiconductor integrated circuit device comprising:

a semiconductor substrate of a first conductivity type;

a thin-film semiconductor layer formed on said semiconductor substrate with an insulation film interposed therebetween;

an integrated circuit formed in said thin-film semiconductor layer and having a power-supply electrode established at a power supply potential, a ground electrode electrically connected to said semiconductor substrate and established at a ground potential, and a signal-input electrode established at a potential between said power-supply potential and said ground potential;

a first diffusion layer composed of a diffusion layer of a second conductivity type formed within said semiconductor substrate and electrically connected to said power supply electrode, adjacent portions of said first diffusion layer and said semiconductor substrate together defining a first PN junction; and a second diffusion layer composed of a diffusion layer of the second conductivity type formed within said semiconductor substrate and electrically connected to said signal-input electrode, adjacent portions of said second diffusion layer and said semiconductor substrate together defining a second PN junction, wherein voltage surges between said power-supply electrode and said ground electrode are absorbed by said first PN junction between said first diffusion layer and said semiconductor substrate, voltage surges between said signal-input electrode and said ground electrode are absorbed by said second PN junction between said second diffusion layer and said semiconductor substrate, and voltage surges between said power-supply electrode and said signal-input electrode are absorbed by causing avalanche breakdown at either of said first and second PN junctions.

3. A semiconductor integrated circuit device according to claim 2, wherein said first diffusion layer and said second diffusion layer are formed adjacently within said semiconductor substrate.

4. A semiconductor integrated circuit device according to claim 2, further comprising:

first and second contact holes formed in said insulation film through which said semiconductor substrate and said thin-film semiconductor layer communicate, said first diffusion layer and said second diffusion layer being respectively connected via said first and second contact holes to said power-supply electrode and said signal-input electrode.

5. A semiconductor integrated circuit device comprising:

a semiconductor substrate of a first conductivity type;

a thin-film semiconductor layer formed on said semiconductor substrate with an insulation film interposed therebetween;

an integrated circuit formed in said thin-film semiconductor layer and having a ground electrode electrically connected to said semiconductor substrate and established at ground potential, a power-supply terminal established at power-supply voltage, and a signal-input portion electrically connected to a signal-input terminal to input signals from an external portion;

a first diffusion layer composed of a diffusion layer of a second conductivity type formed within said semiconductor substrate and electrically connected to said power-supply terminal adjacent portions of said first diffusion layer and said semiconductor substrate together defining a first PN junction; and a second diffusion layer composed of a diffusion layer of the second conductivity type formed within said semiconductor substrate and electrically connected between said signal-input terminal and said signal-input portion adjacent portions of said second diffusion layer and said semiconductor substrate together defining a second PN junction, wherein voltage surges between said power-supply terminal and said signal-input terminal are absorbed by causing avalanche breakdown at either of said first PN function between said first diffusion layer and said semiconductor substrate or said second PN junction between said second diffusion layer and said semiconductor substrate voltage surges between said power-supply terminal and said ground electrode are absorbed by said first PN junction and voltage surges between said signal-input terminal and said ground electrode are absorbed by said second PN junction.

6. A semiconductor integrated circuit device according to claim 5, wherein said first diffusion layer and said second diffusion layer are formed adjacently within said semiconductor substrate.

7. A semiconductor integrated circuit device according to claim 5, wherein said signal-input terminal is electrically connected through said second diffusion layer to said signal-input portion.

8. A semiconductor integrated circuit device according to claim 5, further comprising:

a third diffusion layer within said semiconductor substrate composed of a diffusion layer of the second conductivity type formed adjacently to said second diffusion layer and electrically connected to said ground electrode; and a gate electrode formed within said thin-film semiconductor layer with said insulation film interposed between said semiconductor substrate and said gate electrode, said gate electrode being electrically connected to said signal-input terminal so as to form a channel between said second diffusion layer and said third diffusion layer, wherein surge voltage input between said ground electrode and said signal-input terminal is absorbed by causing a transistor formed by said second diffusion layer, said third diffusion layer and said gate electrode to become conductive.

9. A semiconductor integrated circuit device according to claim 5, further comprising a third diffusion layer composed of a diffusion layer of the second conductivity type formed within said semiconductor substrate and electrically connected to said ground electrode;

wherein surge voltage input between said ground electrode and said power-supply terminal is absorbed by causing avalanche breakdown at either pn diode of a pn diode between said third diffusion layer and said semiconductor substrate or a pn diode between said first diffusion layer and said semiconductor substrate.

10. A semiconductor integrated circuit device according to claim 5, further comprising:
   a fourth diffusion layer composed of a diffusion layer of the first conductivity type formed within said semiconductor substrate and electrically connected to said ground electrode and, along with this, establishing potential of said semiconductor substrate at ground potential.

11. A semiconductor integrated circuit device comprising:
   a semiconductor substrate of a first conductivity type;
   a thin-film semiconductor layer formed on said semiconductor substrate with an insulation film interposed therebetween;
   an integrated circuit having a ground electrode established at ground potential, a power-supply terminal established at power-supply voltage, and a signal-input portion electrically connected to a signal-input terminal to input signals from an external portion, said integrated circuit being formed in said thin-film semiconductor layer;
   a first diffusion layer composed of a diffusion layer of a second conductivity type formed within said semiconductor substrate and electrically connected to said power-supply terminal through a first contact hole formed in said insulation film, adjacent portions of said first diffusion layer and said semiconductor substrate together defining a first PN junction; and
   a second diffusion layer composed of a diffusion layer of the second conductivity type formed within said semiconductor substrate and electrically connected between said signal-input terminal and said signal-input portion through a second contact hole formed in said insulation film, adjacent portions of said second diffusion layer and said semiconductor substrate together defining a second PN junction,
   wherein voltage surges between said power-supply terminal and said signal-input terminal are absorbed by causing avalanche breakdown at either of said first PN junction between said first diffusion layer and said semiconductor substrate or said second PN junction between said second diffusion layer and said semiconductor substrate, voltage surges between said power-supply terminal and said ground electrode are absorbed by said first PN junction and voltage surges between said signal-input terminal and said ground electrode are absorbed by said second PN junction.

12. A semiconductor integrated circuit device comprising:
   a semiconductor substrate of a first conductivity type;
   a thin-film semiconductor layer formed on said semiconductor substrate with an insulation film interposed therebetween;
   an integrated circuit formed in said thin-film semiconductor layer and having a power-supply electrode established at a power-supply potential, a ground electrode established at a ground potential, and a signal-input electrode established at a potential between said power-supply potential and said ground potential;
   a first diffusion layer composed of a diffusion layer of a second conductivity type formed within said semiconductor substrate and electrically connected to said power supply electrode, adjacent portions of said first diffusion layer and said semiconductor substrate together defining a first PN junction;
   a second diffusion layer composed of a diffusion layer of a second conductivity type formed within said semiconductor substrate and electrically connected to said signal-input electrode, adjacent portions of said second diffusion layer and said semiconductor substrate together defining a second PN junction; and
   a third diffusion layer composed of a diffusion layer of the first conductivity type formed within said semiconductor substrate and electrically connected to said ground electrode so that said third diffusion layer establishes potential of said semiconductor substrate,
   wherein voltage surges between said power-supply electrode and said signal-input electrode are absorbed by causing breakdown at either of said first PN junction between said first diffusion layer and said semiconductor substrate or said second PN junction between said second diffusion layer and said semiconductor substrate, voltage surges between said power-supply electrode and said ground electrode are absorbed by said first PN junction, and voltage surges between said signal-input electrode and said ground electrode are absorbed by said second PN junction.

13. A semiconductor integrated circuit device comprising:
   a semiconductor substrate of a first conductivity type;
   a semiconductor layer disposed on said semiconductor substrate with an insulation film interposed therebetween;
   an integrated circuit having a semiconductor element formed in said semiconductor layer;
   a ground terminal for supplying a ground potential to said integrated circuit and electrically connected to said semiconductor substrate;
   a power-supply terminal for supplying a power-supply voltage to said integrated circuit;
   a signal terminal for communicating an electric signal between an external portion and said integrated circuit;
   a first protective circuit composed of a first layer of a second conductivity type disposed within said semiconductor substrate and electrically connected to said signal terminal, adjacent portions of said first layer and said semiconductor substrate together defining a first PN junction, said first protective circuit protecting said integrated circuit from voltage surges between said signal terminal and said ground terminal by absorbing the voltage surges at said first PN junction; and
   a second protective circuit composed of a second layer of a second conductivity type disposed within said semiconductor substrate and electrically connected to said power-supply terminal, adjacent portions of said second layer and said semiconductor substrate together defining a second PN junction, said second protective circuit protecting said integrated circuit from voltage surges between said power-supply terminal and said ground terminal by absorbing the voltage surges at said second PN junction,
   wherein voltage surges between said power-supply terminal and said signal terminal are absorbed by both said first and second PN junctions.

14. A semiconductor integrated circuit device according to claim 13, wherein said first layer and said second layer are disposed adjacently within said semiconductor substrate.

15. A semiconductor integrated circuit device according to claim 13, wherein said second protective circuit includes a diode structure.

16. A semiconductor integrated circuit device according to claim 13, wherein said second layer is disposed in said semiconductor substrate and formed so as to exhibit electrical conduction by causing a breakdown at said second PN junction when the voltage surges are applied to said power-supply terminal.

17. A semiconductor integrated circuit device comprising:

an integrated circuit formed in a thin-film semiconductor layer disposed on a semiconductor substrate with an insulation film interposed therebetween and having a first withstand voltage, said integrated circuit being provided with a signal-input terminal, a maximum-potential terminal and a minimum-potential terminal, a signal voltage less than a value of said first withstand voltage being applied between said signal-input terminal and said maximum-potential terminal and between said signal-input terminal and said minimum-potential terminal;

a first protective element provided between said signal-input terminal and said minimum-potential terminal and including a first PN junction having a second withstand voltage which is greater than said signal voltage and less than said first withstand voltage, wherein voltage surges greater than said second withstand voltage between said signal-input terminal and said minimum-potential terminal are absorbed by said first protective element which becomes conductive in response thereto; and a second protective element provided between said maximum-potential terminal and said minimum-potential terminal and including a second PN junction having a third withstand voltage which is greater than said signal voltage and less than said first withstand voltage, wherein voltage surges greater than said third withstand voltage between said maximum-potential terminal and said minimum-potential terminal are absorbed by said second protective element which becomes conductive in response thereto, wherein said second protective element is electrically connected to said first protective element through said minimum-potential terminal, and one of said first and second PN junctions is connected in a forward direction and the other is connected in a reverse direction between said signal-input terminal and said maximum-potential terminal.

18. A semiconductor integrated circuit device according to claim 17, wherein said first protective element and said second protective element are disposed within said semiconductor substrate.

19. A semiconductor integrated circuit device according to claim 17, further comprising:

a potential establishing diffusion layer of a same conductivity type as said semiconductor substrate, formed within said semiconductor substrate and electrically connected to said minimum-potential terminal to establish a potential of said semiconductor substrate;

a first diffusion layer of an opposite conductivity type to said semiconductor substrate, formed within said semiconductor substrate and electrically connected to said signal-input terminal, adjacent portions of said first diffusion layer and said semiconductor substrate together defining said first PN junction in said first protective element; and a second diffusion layer of the opposite conductivity type to said semiconductor substrate, formed within said semiconductor substrate and electrically connected to said maximum-potential terminal, adjacent portions of said second diffusion layer and said semiconductor substrate together defining said second PN junction in said second protective element.

20. A semiconductor integrated circuit device according to claim 19, wherein said first diffusion layer and said second diffusion layer are formed in adjacent positions.

21. A semiconductor integrated circuit device according to claim 20, further comprising:

a FET diffusion layer of the opposite conductivity type to said semiconductor substrate, formed within said semiconductor substrate; and a gate electrode formed on said semiconductor substrate with an insulation film interposed therebetween so as to be located over a surface between said FET diffusion layer and said first diffusion layer, wherein a MOSFET for input-protection use is formed between said signal-input terminal and said minimum-potential terminal by electrically connecting said first diffusion layer and said gate electrode to said signal-input terminal and by causing said FET diffusion layer to be equipotential with said potential establishing diffusion layer.

22. A semiconductor integrated circuit device comprising:

an integrated circuit formed in a thin-film semiconductor layer disposed on a semiconductor substrate with an insulation film interposed therebetween and having a withstand voltage, said integrated circuit being provided with a signal-input terminal, maximum-potential terminal and minimum-potential terminal, a signal voltage less than a value of said withstand voltage being applied between said signal-input terminal and said maximum-potential terminal and between said signal-input terminal and said minimum-potential terminal;

a first protective element provided between said signal-input terminal and minimum-potential terminal, said first protective element having a first threshold voltage which is larger than said signal voltage and is less than said withstand voltage, wherein current caused by voltage surges greater than said first threshold voltage between said signal-input terminal and minimum-potential terminal flows through said first protective element which becomes conductive in response to the voltage surges; and a second protective element provided between said maximum-potential terminal and minimum-potential terminal, said second protective element having a second threshold voltage which is greater than said signal voltage and less than said withstand voltage, wherein current caused by voltage surges greater than said second threshold voltage between said maximum-potential terminal and minimum-potential terminal flows through said second protective element which becomes conductive in response to the voltage surges, wherein said second protective element is electrically connected to said first protective element through said minimum-potential terminal.

23. A semiconductor integrated circuit device according to claim 22, wherein said first protective element and said second protective element are disposed within said semiconductor substrate.

24. A semiconductor integrated circuit device according to claim 22, further comprising:

a potential establishing diffusion layer of a same conductivity type as said semiconductor substrate, formed within said semiconductor substrate and electrically connected to said minimum-potential terminal to establish a potential of said semiconductor substrate;

a first diffusion layer of an opposite conductivity type to said semiconductor substrate, formed within said semiconductor substrate and electrically connected to said signal-input terminal, adjacent portions of said first diffusion layer and said semiconductor substrate together forming a PN junction in said first protective element; and a second diffusion layer of the opposite conductivity type to said semiconductor substrate, formed within said semiconductor substrate and electrically connected to said maximum-potential terminal, adjacent portions of said second diffusion layer and said semiconductor substrate together forming a PN junction in said second protective element.

25. A semiconductor integrated circuit device according to claim 24, wherein said first diffusion layer and said second diffusion layer are formed in adjacent positions.

26. A semiconductor integrated circuit device according to claim 25, further comprising:

a FET diffusion layer of the opposite conductivity type to said semiconductor substrate, formed within said semiconductor substrate; and a gate electrode formed on said semiconductor substrate with an insulation film interposed therebetween so as to be located over a surface between said FET diffusion layer and said first diffusion layer, wherein a MOSFET for input-protection use is formed between said signal-input terminal and said minimum-potential terminal by electrically connecting said first diffusion layer and said gate electrode to said signal-input terminal and by causing said FET diffusion layer to be equipotential with said potential establishing diffusion layer.

27. A semiconductor integrated circuit device comprising:

a semiconductor substrate of a first conductivity type;

a thin-film semiconductor layer formed on said semiconductor substrate with an insulation film interposed therebetween;

an integrated circuit formed in said thin-film semiconductor layer and having a power-supply electrode established at a power-supply potential, a ground electrode established at a ground potential, and a signal-input electrode established at a potential between said power-supply potential and said ground potential;

a first diffusion layer composed of a diffusion layer of a second conductivity type formed within said semiconductor substrate and electrically connected to said power supply electrode, adjacent portions of said first diffusion layer and said semiconductor substrate together defining a first PN junction, said first PN junction forming a first protective element;

a second diffusion layer composed of a diffusion layer of a second conductivity type formed within said semiconductor substrate and electrically connected to said signal-input electrode, adjacent portions of said second diffusion layer and said semiconductor substrate together defining a second PN junction, said second PN junction forming a second protective element; and a third diffusion layer composed of a diffusion layer of the first conductivity type formed within said semiconductor substrate and electrically connected to said ground electrode so that said third diffusion layer establishes potential of said semiconductor substrate, wherein current caused by voltage surges between said power-supply electrode and said signal-input electrode flows through either of said first protective element or said second protective element, current caused by voltage surges between said power-supply electrode and said ground electrode flows through said first protective element, and current caused by voltage surges between said signal-input electrode and said ground electrode flows through said second protective element.

28. A semiconductor integrated circuit device comprising:

a semiconductor substrate;

a semiconductor layer disposed on said semiconductor substrate with an insulation film interposed therebetween;

an integrated circuit having a semiconductor element formed in said semiconductor layer;

a ground terminal for supplying a ground potential to said integrated circuit and electrically connected to said semiconductor substrate;

a power-supply terminal for supplying a power-supply voltage to said integrated circuit;

a signal terminal for communicating an electric signal between an external portion and said integrated circuit;

a first protective circuit electrically connected between said signal terminal and said ground terminal, said first protective circuit becoming conductive in response to occurrence of voltage surges between said signal terminal and said ground terminal to caused current due to the voltage surges to flow therethrough; and a second protective circuit electrically connected between said power-supply terminal and said ground terminal, said second protective circuit becoming conductive in response to occurrence of voltage surges between said power-supply terminal and said ground terminal to cause current due to the voltage surges to flow therethrough, wherein current due to voltage surges between said power-supply terminal and said signal terminal flows through both said first protective circuit and said second protective circuit.

29. A semiconductor integrated circuit device according to claim 28, wherein said first protective circuit is composed of a first layer of an opposite conductivity type to said semiconductor substrate and disposed within said semiconductor substrate, adjacent portions of said first layer and said semiconductor substrate together defining a first PN junction which becomes conductive in response to the voltage surges between said signal terminal and said ground terminal, and said second protective circuit is composed of a second layer of an opposite conductivity type to said semiconductor substrate and disposed within said semiconductor substrate, adjacent portions of said second layer and said semiconductor substrate together defining a second PN junction which becomes conductive in response to the voltage surges between said power supply terminal and said ground terminal.

30. A semiconductor integrated circuit device according to claim 29, wherein said first layer and said second layer are disposed adjacently within said semiconductor substrate.

31. A semiconductor integrated circuit device according to claim 29, wherein said second protective circuit includes a diode structure.

32. A semiconductor integrated circuit device comprising:

a semiconductor substrate of a first conductivity type;

a thin-film semiconductor layer formed on said semiconductor substrate with an insulation film interposed therebetween;

an integrated circuit formed in said thin-film semiconductor layer and having a power-supply electrode established at a power supply potential, a ground electrode electrically connected to said semiconductor substrate and established at a ground potential, and a signalinput electrode established at a potential between said power-supply potential and said ground potential;

a first diffusion layer composed of a diffusion layer of a second conductivity type formed within said semiconductor substrate and electrically connected to said power supply electrode, adjacent portions of said first diffusion layer and said semiconductor substrate together defining a first PN junction; and a second diffusion layer composed of a diffusion layer of the second conductivity type formed within said semiconductor substrate and electrically connected to said signal-input electrode, adjacent portions of said second diffusion layer and said semiconductor substrate defining a second PN junction, wherein voltage surges between said power-supply electrode and said ground electrode are released via said first PN junction, voltage surges between said signal-input electrode and said ground electrode are released via said second PN junction, and voltage surges between said power-supply electrode and said signal-input electrode are released via either of said first and second PN junctions.

33. A semiconductor integrated circuit device according to clam 32, wherein said first diffusion layer and second diffusion layer are formed adjacently within said semiconductor substrate.

34. A semiconductor integrated circuit device according to claim 32, further comprising:

first and second contact holes formed in said insulation film through which said semiconductor substrate and said thin-film semiconductor layer communicate, said first diffusion layer and said second diffusion layer being respectively connected via said first and second contact holes to said power-supply electrode and said signal-input electrode.

35. A semiconductor integrated circuit device according to claim 32, wherein said signal input electrode is electrically connected through said second diffusion layer to a signalinput portion of said integrated circuit.

36. A semiconductor integrated circuit device according to claim 32, further comprising:

a third diffusion layer of the second conductivity type, formed adjacently to said second diffusion layer within said semiconductor substrate and electrically connected to said ground electrode; and a gate electrode formed within said thin-film semiconductor layer with said insulation film interposed between said semiconductor substrate and said gate electrode, said gate electrode being electrically connected to said signal-input electrode so as to form a channel between said second diffusion layer and said third diffusion layer, wherein voltage surges between said ground electrode and said signal input electrode are released by causing a transistor formed by said second diffusion layer, said third diffusion layer and said gate electrode to become conductive.

37. A semiconductor integrated circuit device according to claim 32, further comprising:

a third diffusion layer of the second conductivity type, formed within said semiconductor substrate and electrically connected to said ground electrode, wherein voltage surges between said ground electrode and said power-supply electrode are released by causing avalanche breakdown at either of a PN diode between said third diffusion layer and said semiconductor substrate and a PN diode between said first diffusion layer and said semiconductor substrate.

38. A semiconductor integrated circuit device according to claim 32, further comprising:

a fourth diffusion layer composed of a diffusion layer of the first conductivity type formed within said semiconductor substrate and electrically connected to said ground electrode and establishing potential of said semiconductor substrate at ground potential.

* * * * *